United States Patent [19]

Hochstein

[11] E Patent Number: Re. 32,526

[45] Reissued Date of Patent: Oct. 20, 1987

[54] GATED SOLID STATE FET RELAY

[76] Inventor: Peter A. Hochstein, 2966 River Valley Dr., Troy, Mich. 48098

[21] Appl. No.: 934,550

[22] Filed: Nov. 24, 1986

Related U.S. Patent Documents

Reissue of:

[64] Patent No.: 4,603,269
Issued: Jul. 29, 1986
Appl. No.: 624,277
Filed: Jun. 25, 1984

[51] Int. Cl.[4] ..... H03K 17/00; H03K 5/22; H03K 17/56

[52] U.S. Cl. ..... 307/571; 307/270; 307/246; 307/594

[58] Field of Search ..... 307/571-585, 307/270, 594, 300, 246; 363/59; 331/153

[56] References Cited

U.S. PATENT DOCUMENTS 3,914,711 10/1985 Carlson et al. ..... 331/153
4,420,700 12/1983 Fay et al. ..... 307/571

*Primary Examiner*—Stanley D. Miller
*Assistant Examiner*—B. P. Davis
*Attorney, Agent, or Firm*—Harold W. Milton, Jr.

[57] ABSTRACT

A solid state relay circuit for switching power to an electrical load including an N-channel MOS-FET (20) having a drain (22) and source (24) and gate (26) terminals with the drain terminal (22) connected to the positive power supply lead (16) and the source terminal (24) connected to the load lead (12). The MOS-FET (20) is driven into conduction by being supplied voltage from a voltage multiplier (28-34) which is in turn supplied by a gated oscillator (36) which receives its power from an amplifier (38). Resistors (74, 76) may be added for slowly allowing the MOS-FET (20) to move into full conduction and/or for slowly decreasing the conduction of the MOS-FET. All this is in response to an electrical signal on a low level signal input lead (18).

14 Claims, 3 Drawing Figures

GATED SOLID STATE FET RELAY

Matter enclosed in heavy brackets [ ] appears in the original patent but forms no part of this reissue specification; matter printed in italics indicates the additions made by reissue.

BACKGROUND OF THE INVENTION

High side switching of d.c. electrical circuits is widely used in many applications. In common automotive practice high side switching reduces the number of wires that need to be run to various loads. Only one switched "hot" line is required per load since the return current path is through the shared ground connection.

Mechanical switches and relays normally control the operation of various automotive electrical loads; however, such contact mechanisms are not very reliable when high current or high voltages are switched. Solid state switches or relays have been used at lower current levels for some time where the power losses in the relay are overshadowed by the greater reliability afforded by solid state designs.

At higher current levels, such as those encountered in automobiles, up to 30 Amperes would have to be switched. The nominally 0.7 Volt collector-emitter saturation voltages encountered in bipolar transistor switches would, when controlling a 10 Amp current, causes a transistor dissipation of at least $0.7\ V \times 10\ A = 7$ Watts. This heat would have to be dissipated in a rather large heat sink, especially at elevated ambient temperatures.

Newer power MOS-FETS (metal oxide semiconductor-field effect transistors) with saturated "on" resistances ($R_{DS}$ on) of approximately 0.01 Ohms would allow a 10 A load to be controlled with a dissipative switch ($I^2R$) loss of only 1 Watt.

P-channel MOS-FETS are ideally used for high side switching because input biasing and control is simplified. However, the geometry and manufacture of P-channel MOS-FETS produces devices with "on" resistances much higher than equivalent die size N-channel transistors. This intrinsic difference in P and N channel devices is reflected in their cost; the N-channel part being significantly less expensive.

Simple substitution of a P-channel FET by an equivalent N-channel device is not effective. In order to achieve the low forward voltage drop behavior of the field effect transistor in fully saturated mode, the gate voltage must rise above the drain voltage. When N-channel FETS are used for high side switching of a positive supply, a level-shifting circuit is required if the FET is to be effectively switched "on" by a voltage lower than the load supply voltage.

These level-shifting circuits are required because when a high side N-channel FET is turned "on", the source voltage is driven to the positive supply rail. The gate cannot go positive with respect to the drain (connected to the supply rail) because without an added power supply, the gate cannot rise above the source (when the FET is "on"), and genrally $V_{GS}$ must exceed 5 to 10 Volts minimum for $I_{DS}$ to be saturated.

The extremely high input resistance of MOS-FET power transistors allows several unique schemes to be used for raising the gate control voltage ($V_{GS}$ above the load supply voltage). Currently known level-shifting methods are discussed in detail in "High Side Switching With N-Channel MOS-FETS" by J. W. Kerr, Jr. published in the Feb. 7, 1984 issue of Electronic Products.

All known level-shifting means adapted to d.c. high side switching exhibit certain performance problems. Ideally, a MOS-FET switch or relay should emulate the performance of its electromechanical counterpart, i.e., low forward voltage drop and zero off-state current drain. The d.c. switching circuits described by J. W. Kerr, Jr. in the Electronic Products article include a transformerless voltage multiplier circuit where a separate high voltage generator is connected to the gate by auxilliary switching transistors. The standby current of this circuit is very high because the high voltage generator runs all the time.

STATEMENT OF THE INVENTION

A solid state relay circuit for switching power to an electrical load including a load lead for connection to the electrical load and a positive supply lead for connection to a source of positive electrical potential and a negative supply lead for connection to a source of negative electrical potential as well as a control signal lead. An N-channel MOS-FET has drain, source and gate terminals with the drain terminal connected to the positive power supply lead and the source terminal connected to the load level. A gated oscillator means receives power from the power supply lead and is connected to a control signal lead and has an output terminal and oscillates to produce a voltage at the output terminal and ceases oscillation to terminate voltage at the output terminal in response to electrical signals on the control signal lead. A voltage multiplier means interconnects the oscillator output terminal and the gate of the MOS-FET for multiplying the output voltage from the oscillator means and applying same to the gate for driving the MOS-FET into conduction to power the load during the oscillation of the oscillator means.

FIGURES IN THE DRAWINGS

Other advantages of the present invention will be readily appreciated as the same becomes better understood by reference to the following detailed description when considered in connection with the accompanying drawings wherein:

FIG. 2 is a modification which may be made to the circuit of FIG. 1 for implementing a slow turn-on.

Figure 1:
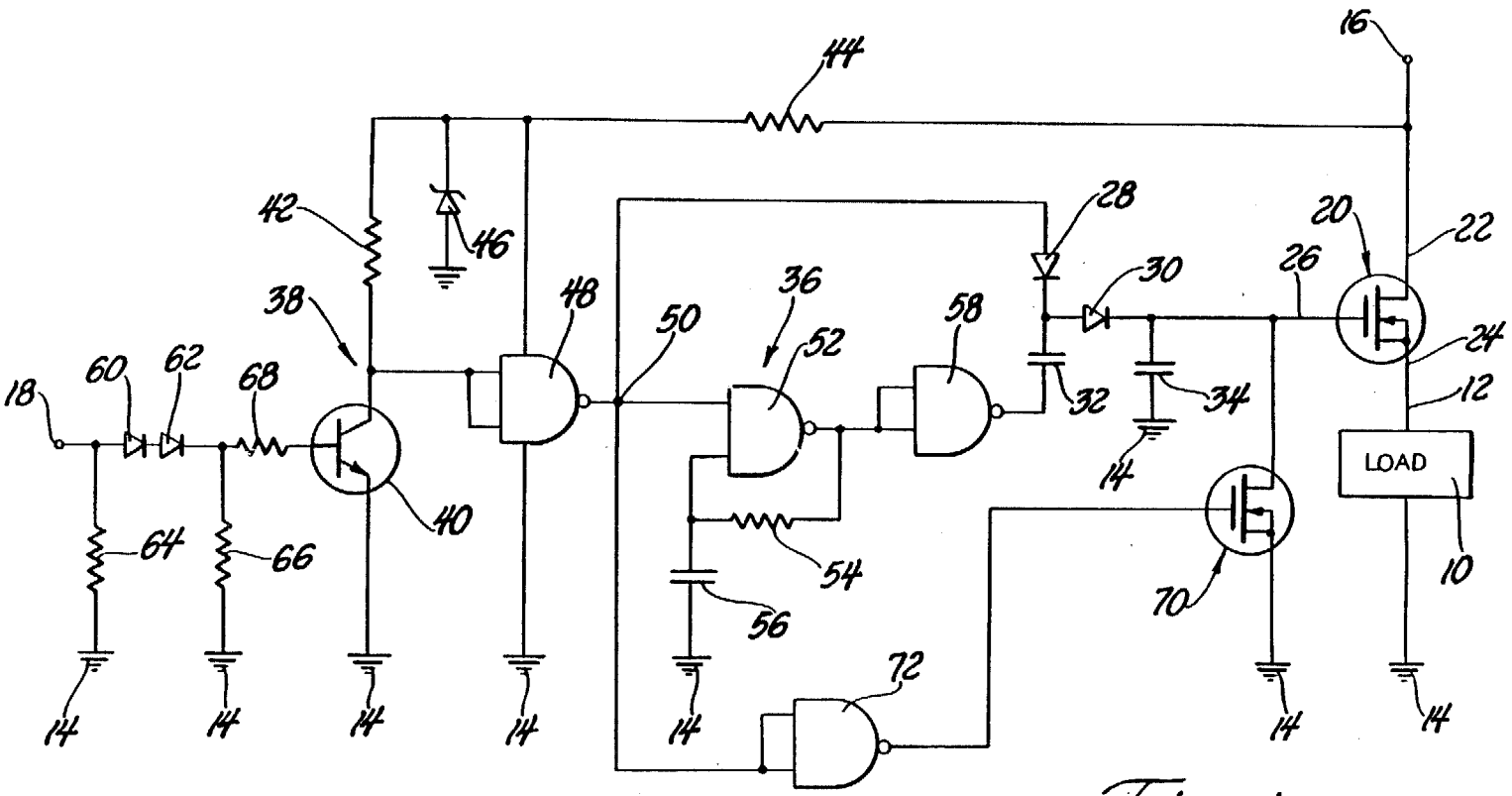
FIG. 1 is an illustration of a preferred embodiment of the circuit of the subject invention.

A solid state relay circuit is illustrated in FIG. 1 and is utilized for switching electrical power to an electrical load 10. The electrical load 10 is of the type typically found in an automotive vehicle having a 12 Volt battery, i.e., electrical supply system.

The circuit includes a load lead 12 for connection to the electrical load 10 which is, in turn, connected to a negative electrical potential or ground as indicated at 14. Also included is a positive supply lead 16 for connection to a source of positive electrical potential such as the 12 Volt system in an automotive vehicle. The circuit also includes a control signal lead 18 for carrying electrical signals to turn the circuit on and off for supplying electrical power to the load 10 and likewise terminating power to the load 10 when in the off mode.

The circuit includes an N-channel MOS-FET generally indicated at 20 and having drain, source and gate terminals 22, 24 and 26 respectively. The drain terminal 22 is connected to the positive power supply lead 16 and the source terminal 24 is connected to the load lead 12.

First and second diodes 28 and 30 along with first and second capacitors 32 and 34 define a voltage multiplier means connected to the gate 26 of the MOS-FET 20 for multiplying the output voltage from a gated oscillator means generally shown at 36.

More specifically, the oscillator means 36 is a gated free running square wave oscillator means for producing a square [way] *wave* in response to receiving the output from a [levle] *level*-shifting stage generally shown at 38. The level-shifting stage 38 includes a first npn bipolar transistor 40 interconnecting the control signal lead 18 and the positive 16 and negative 14 electrical potentials. The transistor 40 is connected to the positive electrical [potentioal] *potential* 16 through resistors 42 and 44 which has associated therewith zener diode 46. The resistor 44 and zener diode 46 acting to protect the transistor 40 and CMOS gates 48, 52, 58, and 72 against over voltage supplied from the positive potential 16. The level-shifting stage 38 also includes a first integrated circuit means 48 interconnecting the first transistor 40 and the positive 16 and negative 14 electrical potentials for inverting the output of the first transistor 40 to provide a digital level-shifting stage output at the terminal 50.

The gated free running oscillator means 36 includes a second integrated circuit means 52 connected to resistor 54 and capacitor 56 to define the oscillator means. A third integrated circuit means 58 is configured as a buffer-inverter to drive the voltage multiplier circuit.

The first diode 28 of the voltage multiplier has its output combined with the output of the oscillator means 36 through the first capacitor 32 and is supplied power from the output of the level-shifting stage 38 so that it is responsive to the electrical signals at the control signal lead 18. The first capacitor 32 is disposed between the output of the oscillator means 36 and the junction of the first and second diodes 28 and 30 whereas the second capacitor 34 is disposed between the negative electrical potential 14 and the output of the second diode 30.

The level-shifting stage 38 is an amplifier means interconnecting the control signal lead 18 and a gated oscillator means 36 for amplifying low level input voltages on the control signal lead 18 to a sufficient voltage consistent with CMOS logic levels. Thus, the first diode 28 is supplied power from the output of the voltage amplifier at the junction 50.

There is also included third and fourth diodes 60 and 62 and associated resistors 64, 66 and 68 interconnecting the control signal lead, the negative electrical potential 14 and the base of the first transistor 40 for establishing a minimum voltage level from the control signal lead 18 for driving the first transistor 40 into conduction. The diodes 60 and 62 are in series and disposed between the leads of the resistors 64 and 66 which extend to ground. The resistor 68 extends between the terminal of the resistor 66 and the output of diode 62 and the base of transistor 40.

A second transistor generally indicated at 70 interconnects the gate 26 of the MOS-FET 20 and the negative electrical potential 14 and the level-shifting stage or amplifier means 38 output at 50 to pull the gate of the MOS-FET 20 to the negative electrical potential 14 in the absence of a signal at the output 50 of the stage 38. A gate driving or discharge integrated circuit inverter means 72 is disposed between and interconnects the output 50 of the level-shifting stage or amplifier 38 and the second transistor 70 for inverting the level-shifting stage output at 50 so that the second transistor 70 is driven into conduction to allow conduction from the gate 26 of the MOS-FET 20 to the negative electrical potential 14 in response to a lack of output at the level-shifting stage output 50.

Figure 2:
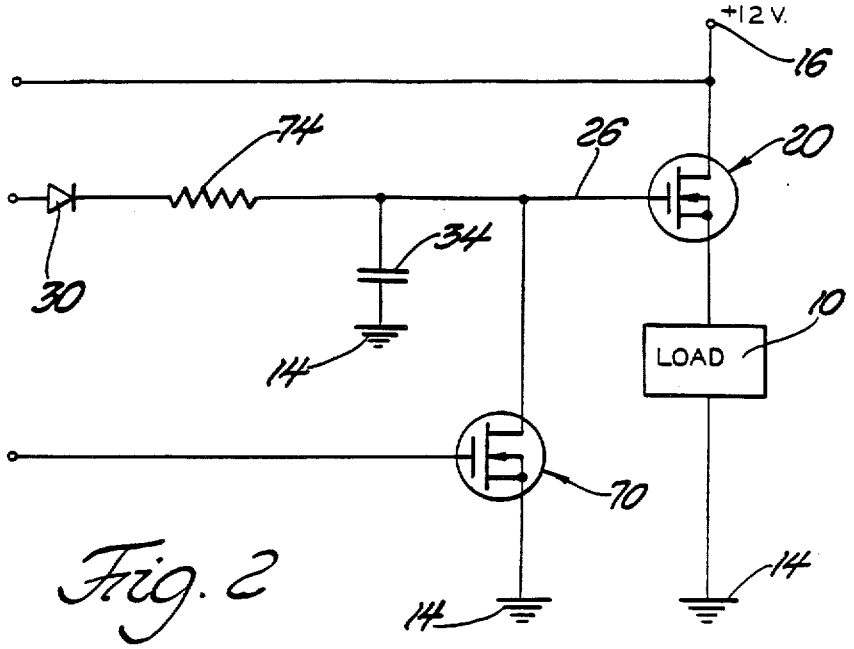
Figure 3:
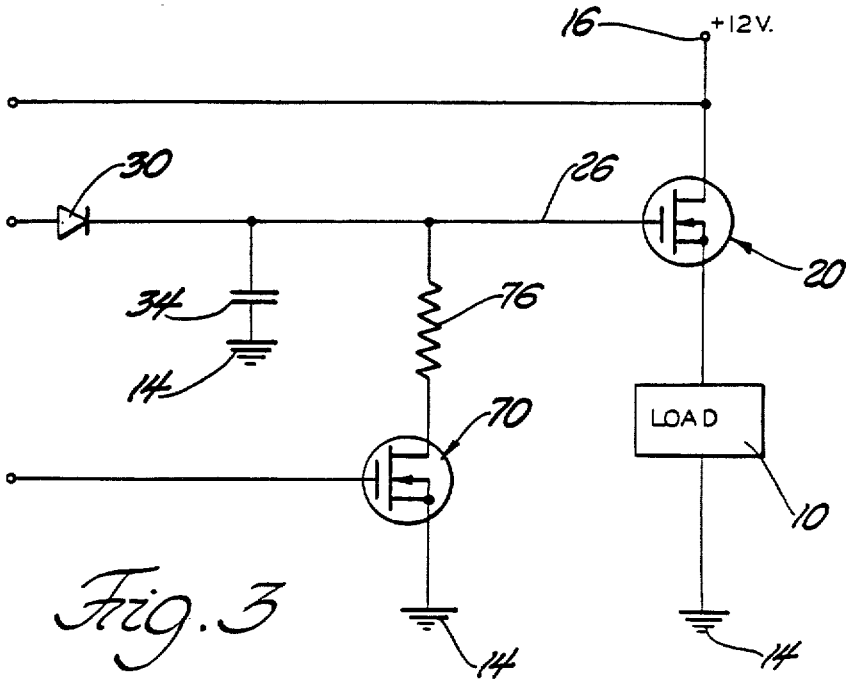
FIG. 3 is a modification which may be made to the circuit of FIG. 1 to implement a slow turnoff of the circuit.

A modification is illustrated in FIG. 2 wherein there is included a slow turn on resistor 74 for slowly driving the MOS-FET 20 into conduction by controlling the charging rate of the second capacitor 34 and thus the rate of voltage increase on the gate 26 of MOS-FET 20. As an alternative or another modification there is shown in FIG. 3 a slow turn-off resistor means 76 for slowly decreasing and terminating the conduction of the MOS-FET 20. The slow turn-off resistor 76 is disposed between the gate 26 of the MOS-FET 20 and the second transistor 70 for slowly decreasing and terminating conduction of the MOS-FET 20. The slow turn-on resistor 74 is disposed between the second diode 30 and the second capacitor 34 for controlling the voltage decay rate across the second capacitor 34.

The high side N-channel power MOS-FET relay circuit shown in FIG. 1 is unique in several aspects. Instead of using a separate high voltage generator and/or transformer with separate control element(s) to connect the gate of the MOS-FET to this source of higher voltage, an integral gated CMOS oscillator is used to directly control the power MOS-FET 20.

The power N-channel MOS-FET 20 is connected as a high side switch, with the drain 22 connected to the positive supply rail 16 and the source 24 connected to the load 10. The gate 26 derives its gate signal from a gated voltage doubler circuit made up of I.C.52, I.C.58, D28, D30, D32 and C34. One quarter of a CMOS CD4093BE 2-input NAND gate 52 is connected as a gated free running square wave oscillator running at about 70 Khz; I.C.58 being configured as a buffer-inverter to drive the transformerless voltage multiplier made up of C32, D28, D30, C34. This multiplier is normal in most respects, except that the power supply connection through diode D28 is derived through I.C.48. In order for I.C.52 to oscillate and develop high voltage, the oscillator control input terminal 50 driven by I.C.48 must be high. If the control input 18 is held low, the gated oscillator 52 does not run, so that no high voltage is delivered to the gate 26 of the MOS-FET 20. Without gate drive the MOS-FET 20 is "off", interrupting current flow to the load 10.

Relays such as the one shown typically must operate from low (4–12 Volt) control voltages developed by microcomputers. The level-shifting input stage consisting of bipolar transistor 40 is configured to purposely draw some 2 mA of operating current to provide noise immunity. Whenever the input goes high, the collector of 40 goes low. I.C.48 is connected as an inverter, so a high input control signal causes the gated oscillator to start oscillating, generating a square wave, feeding the voltage doubler, thereby turning "on" the power MOS-FET 20.

I.C.48 also feeds a controlled supply voltage to the voltage multiplier diode D28, so that in the absence of an input signal with I.C.48's output low, no voltage appears at the junction of D28 and D30. If D26 were connected directly to the supply, the MOS-FET 20 gate 26 would see the supply voltage even with no input signal present, causing partial conduction of MOS-FET 20.

MOS-FET transistor 70 is a low power N-channel type, and is used to pull the gate of the power MOS-FET 20 to ground whenever the relay is "off". This low impedance path to ground for the gate 26 of the power MOS-FET 20 insures fast, stable turn off behaviour and improves the noise immunity of the circuit. Also, as in bipolar tansistor practice, the rated breakdown voltage of the transistor switch ($BV_{CE}$ or $BV_{DS}$) is achieved only when the base or gate is connected to the emitter or source through a low impedance path. Additionally, when 70 is turned on, it discharges C34, the filter storage capacitor for the voltage multiplier. Transistor 70 is turned "on" whenever there is no input signal 18 to the relay, because the output 50 of I.C.48 would then be low and I.C.72, wired as an inverter, would generate a high output to the gate of transistor 70. R44 is a zener current-limiting resistor, while the 18 Volt zener diode Z46 provides over voltage transient protection for the CMOS gates and the bipolar transistor 40.

Diodes D60 and D62 further improve input stage noise immunity by requiring any input turn-on signal to be greater than approximately 2.1 Volts, which is the sum of the forward drops of diodes D60 and D62 and $V_{BE}$ for transistor 40.

Using an FET solid state switch as a control element allows unique tailoring of the ON-OFF switching rate. In mechanical switches or relays the current is, of course, either on or off as the contacts respectively close or open. The same is true when SCRs (Silicon Controlled Rectifiers) or Triacs are used to switch d.c. power.

Bipolar transistors and FETs can, however be partially turned on to limit current or voltage applied to loads. For example, the high transient inrush (turn-on) currents associated with some loads, such as incandescent lamps, can be effectively controlled by slowly turning "on" the FET power switch. By slowly decreasing the FET resistance, from virtually infinite to the very low $R_{DS}$(on), the voltage delivered to the load increases slowly from zero to virtually the supply rail voltage. In slowly increasing, over a period of 1-200 milliseconds typically, this voltage causes the load current to also slowly increase from zero to the rated load current.

By controlling the rate of current rise in loads such as incandescent lamps and d.c. motors, the very high peak currents associated with these devices is limited to more acceptable values. Since high transient currents cause electromagnetic interference and shorten the life of electric components, slow turn-on (sometimes called soft start) FET switches are very useful.

Minor modifications to the FET switch shown in FIG. 1 convert the circuit to a slow turn-on variant shown in FIG. 2. As discussed earlier, the gate 26 drive signal for the output power MOS-FET 20 is developed by a gated oscillator 36 and a voltage doubler circuit consisting of D28, D30, C32, and [C43] *C34*. If the filter-storage capacitor C34 is not allowed to charge rapidly, but is slowly charged by the imposition of a current-limiting resistor 74 between the output of the doubler and capacitor C34, then the voltage across C34 builds up slowly from zero in a period of time controlled by the RC time constant of R74 and C34.

Since the voltage across C34 is in fact the gate drive to MOS-FET 20, the output power MOS-FET 20 is slowly driven into conduction, at the charging rate of C34. For control of inrush currents to incandescent lamps, R74 might be 100K Ohms and C34 could equal 1 microFarad for a time constant of approximately 200 milliseconds, remembering that the charging time for C34 is also a function of the multiplier source impedance.

Naturally, the output MOS-FET 20 operates in linear mode throughout the slow turn-on cycle, so that dissipation during the turn-on phase is increased according to W (dissipation) $= R_{DS} \times I^2$ (load current).

By allowing C34 to discharge slowly when the relay circuit is de-energized, a slow or soft turn-off feature is realized. This variant is shown in FIG. 3. By increasing the voltage doubler filter-storage capacitor C34 to approximately 1 uF and introducing a discharge rate limiting resistor R76 of about 150K Ohm, the turn-off characteristic of the output switch MOS-FET 20 is slowed to about 200 milliseconds. As the MOS-FET 20 now goes through a linear turn-off phase, its dissipation is again marginally increased.

The function of transistor 70 is still the same as in FIG. 1, where transistor 70 is "on" whenever the relay is "off". If the ultra low forward voltage drop behaviour of the circuits in FIGS. 1, 2 or 3 can be compromised, that is, if a slightly higher drop were permissible, transistor 70 in FIG. 3 could be eliminated and resistor R76 simply connected between the gate 26 of MOS-FET 20 and ground 14. The resulting 8% to 10% increase in voltage drop across the power switch MOS-FET 20 does increase dissipation, but this modification decreases component count.

Whichever specific circuit is used to slowly turn off loads such as solenoids, the slowed down collapse of current through these inductors greatly diminishes the high reverse induction voltages that are normally created when such inductors are de-energized.

Inductive loads which once presented difficulties because of high voltage transient generation, attendant radio frequency interference generation and severe contact erosion can now be simply and economically switched.

The improvements realized with the invention over existing solid state d.c. relays or static switches are manifold. At a typical operating voltage of 12 Volts (d.c.) the forward voltage drop at a 1 Ampere load is under 0.03 Volts. At 4 A the drop increases to 0.08 Volts while at 10 A the drop is under 0.2 Volts. The off state current drain is under 0.1 microAmpere over the full operating temperature range.

Illustrative values of the various components are: Resistors: 64, 10K Ohms; 66 10K Ohms; 68, 10K Ohms; 42 10K Ohms; 44, 330 Ohms; 74, 150K Ohms; and 76, 150K ohms. Capacitors: 56, 1000 pF; 32, 0.1 uF; 34, 0.1 uF. Diodes: 60, 62, IN4148; 28, 30 IN4148; 46, 18, [21] *volt zener*. MOS-FET 20; "SIEMENS"-BUZ 11A Transistors: 40, 2N3904; 70 "SILICONIX" VN10KN. The integrated circuits 48, 52, 58, 72 are one unit: RCA"-CD4093, each being one quarter thereof.

The invention has been described in an illustrative manner, and it is to be understood that the terminology which has been used is intended to be in the nature of words of description rather than of limitation.

Obviously, many modifications and variations of the present invention are possible in light of the above teachings. It is, therefore, to be understood that within the scope of the appended claims wherein reference numerals are merely for convenience and are not to be in any way limiting, the invention may be practiced otherwise than as specifically described.

I claim:

1. A solid state relay circuit for switching power to an electrical load (10) comprising; a load lead (12) for connection to the electrical load (10), a positive supply lead (16) for connection to a source of positive electrical potential, a control signal lead (18), an N-channel MOS-FET (20) having drain (22) and source (24) and gate (26) terminals with said drain terminal (22) connected to said positive power supply lead (16) and said source terminal (24) connected to said load lead (12), [characterized by] gated oscillator means (36) [receiving power from said power supply lead (16) and] connected to said control signal lead (18) and having an output terminal and for oscillating to produce a voltage at said output terminal and to cease oscillating to terminate voltage at said output terminal in response to electrical signals on said control signal lead (18), and voltage multiplier means (28, 30, 32, 34) interconnecting said oscillator output terminal and said gate (26) of said MOS-FET (20) for multiplying said output voltage from said oscillating means (36) for driving said MOS-FET (20) into conduction to power the load during oscillation of said oscillation means (36)[·] *and characterized by slow change means for controlling the rate of change of the conduction of said MOS-FET (20) to a slow rate of change between zero and full conduction.*

2. A circuit as set forth in claim 1 further characterized by said voltage multiplier including first (28) and second (30) diodes a first (32) and second (34) capacitors, said first diode (28) having its output combined with the output of said oscillator means (36) and being supplied electrical power in response to said electrical signals on said control signal lead (18).

3. A circuit as set forth in claim 2 further characterized by including amplifier means (38) interconnecting said control signal lead (18) and said power supply lead (16) and said gated oscillator means (36) for amplifying low level input voltages on said control signal lead (18) to a sufficient driving voltage level at an output (50) thereof.

4. A circuit as set forth in claim 3 further characterized by said first diode (28) being supplied power from the output (50) of said amplifier *means* (38).

5. A circuit as set forth in either one of claims 1, 2, 3, or 4 further characterized by including signal discharge means (70, 72) interconnecting said gate (26) of said MOS-FET (20) and a negative electrical potential (14) and responsive to electrical signals on said control signal lead (18) for positive and stable turn off of said MOS-FET (20) in the absence of an electrical signal on said control signal lead (18) sufficient for circuit operation.

6. A solid state relay circuit for switching power to an electrical load (10) comprising: a load lead (12) for connection to the electrical load (10); a positive supply lead (16) for connection to a source of positive electrical potential; a source of negative electrical potential (14); a control signal lead (18) for carrying electrical signals to turn the circuit on and off for supplying power to the load (10) when on and terminating power to the load (10) when off; and N-channel MOS-FET (20) having a drain (22) and source (24) and gate (26) terminals with said drain terminal (22) connected to said positive power supply lead (16) and said source terminal (24) connected to said load lead (12); [characterized by] a first transistor (40) interconnecting said control signal lead (18), said positive electrical potential (16), and said negative electrical potential (14); a first integrated circuit means (48) interconnecting said first transistor (40) and said positive (16) and negative (14) electrical potentials for inverting the output of said first transistor (40) to provide a level-shifting stage output (50); a gated free running square wave oscillator means (52) receiving said level-shifting stage out-put (50) for producing a square wave output; voltage multiplier means (28, 30, 32, 34) for multiplying the voltage of said square wave output from said oscillator means and applying same to said gate (26) of said MOS-FET (20) for driving said MOS-FET (20) into conduction to supply electrical power to said load (10) in response to electrical signals on said control signal lead (18); and a second transistor (70) interconnecting said gate (26) of said MOS-FET (20), and said negative electrical potential (14) and said level-shifting stage output (50) to pull said gate (26) of said MOS-FET (20) to said negative electrical potential (14) in the absence of a signal at said level shifting stage output (50)[·]; *and characterized by slow change means for controlling the rate of change of the conduction of said MOS-FET (20) to a slow rate of change between zero and full conduction.*

7. A circuit as set forth in either claim 1 or 6 further characterized by *said slow change means* including slow turn-on [resistor] means (74) for slowly driving said MOS-FET (20) into conduction.

8. A circuit as set forth in either claim 1 or 6 further characterized by *said slow change means* including slow turn off [resistor] means (76) for slowly decreasing and terminating the conduction of said MOS-FET (20).

9. A circuit as set forth in claim 6 further characterized by said voltage multiplier means including first (28) and second (30) diodes and first (32) and second (34) capacitors, said first diode (28) having an output combined with said square wave output of said oscillator means and being supplied power from said level-shifting stage output (50).

10. A circuit as set forth in claim 9 further characterized by including gate discharge integrated circuit means (72) interconnecting said level-shifting stage output (50) and said second transistor (70) for converting the level-shifting stage output (50) so that said second transistor (70) is driven into conduction from said gate (26) of said MOS-FET (20) to said negative electrical potential (14) in response to a lack of output at said level-shifting stage output (50).

11. A circuit as set forth in claim 10 further characterized by including third (60) and fourth (62) diodes and associated resistors (64, 66, 68) interconnecting said control signal lead (18), said negative electrical potential (14) and said first transistor (40) for establishing a minimum voltage level for driving said first transistor (40) into conduction.

12. A circuit as set forth in claim 11 further characterized by including a zener diode (46) and current limiting resistor (44) for providing over-voltage protection between said positive power supply lead (16) and said first transistor (40).

13. A circuit as set forth in claim 6 further characterized by including a slow turn off resistor (76) disposed between said gate (26) of said MOS-FET (20) and said second transistor (70) for slowly decreasing and terminating conduction of said MOS-FET (20).

14. A circuit as set forth in claim 9 further characterized by said first capacitor (32) disposed between said oscillator means (36) and the junction of said first (28) and second (30) diodes and second capacitor (34) being disposed between said negative electrical potential (14) and the output of said second diode (30), a slow turn on resistor (74) disposed between said second diode (30) and said second capacitor (34) for controlling the voltage buildup across said second capacitor (34).

* * * * *

UNITED STATES PATENT AND TRADEMARK OFFICE

CERTIFICATE OF CORRECTION

PATENT NO. : RE 32,526

DATED : October 20, 1987

INVENTOR(S) : Peter A. Hochstein

It is certified that error appears in the above-identified patent and that said Letters Patent are hereby corrected as shown below:

Column 2, line 26, "level" should read --lead--.

Column 7, claim 1, line 23, after "means" insert --connected to said voltage multiplier means (28, 30, 32, 34)--.

Column 8, claim 6, line 16, after "means" insert --connected to said voltage multiplier means (28, 30, 32, 34)--.

Signed and Sealed this

Third Day of May, 1988

*Attest:*

*Attesting Officer*

DONALD J. QUIGG

*Commissioner of Patents and Trademarks*